US006881612B2

(12) United States Patent
Miyasaka (10) Patent No.: US 6,881,612 B2
(45) Date of Patent: Apr. 19, 2005

(54) METHOD OF BONDING A SEMICONDUCTOR ELEMENT TO A SUBSTRATE

(75) Inventor: Hideo Miyasaka, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/212,101

(22) Filed: Aug. 6, 2002

(65) Prior Publication Data

US 2003/0032277 A1 Feb. 13, 2003

(30) Foreign Application Priority Data

| Aug. 8, 2001 | (JP) | ........................................ | 2001-240666 |
| Jun. 26, 2002 | (JP) | ........................................ | 2002-185789 |

(51) Int. Cl.$^7$ ............................................. H01L 21/44
(52) U.S. Cl. ...................... 438/118; 438/113; 438/612; 438/613
(58) Field of Search ................................. 438/612–618; 228/111.5, 115, 124.5

(56) References Cited

U.S. PATENT DOCUMENTS

| 5,633,204 A | * | 5/1997 | Tago et al. | |
| 5,952,718 A | * | 9/1999 | Ohtsuka et al. | |
| 5,976,964 A | * | 11/1999 | Ball | |
| 6,207,473 B1 | * | 3/2001 | Hirai et al. | |
| 6,232,563 B1 | * | 5/2001 | Kim et al. | |
| 6,267,650 B1 | * | 7/2001 | Hembree | |
| 6,282,780 B1 | * | 9/2001 | Waki et al. | ................... 29/840 |
| 6,468,832 B1 | * | 10/2002 | Mostafazadeh | |

FOREIGN PATENT DOCUMENTS

JP          10-032224          2/1998

* cited by examiner

Primary Examiner—Ha Tran Nguyen
(74) Attorney, Agent, or Firm—Oliff & Berridge, PLC (57) ABSTRACT

A conductive member is provided on each of electrodes of a semiconductor element. The conductive member is pressed into a shape having a height of approximately two-thirds of the original height to provide a bump. The semiconductor element is caused to face a substrate having an interconnecting pattern with an interposed adhesive containing an insulating filler. At least one of the semiconductor element and the substrate is pressed to electrically connect the bumps to the interconnecting pattern.

11 Claims, 8 Drawing Sheets

FIG. 2C $B \leqq \frac{2}{3} A$

METHOD OF BONDING A SEMICONDUCTOR ELEMENT TO A SUBSTRATE

This application incorporates herein by reference the entire of Japanese Patent Application No. 2001-240666 filed on Aug. 8, 2001 and Japanese Patent Application No. 2002-185789 filed on Jun. 26, 2002.

BACKGROUND OF THE INVENTION

The present invention relates to a semiconductor device, a method of manufacturing the same, a circuit board and an electronic instrument.

In the case of mounting a semiconductor chip face down on a substrate, the semiconductor chip can be firmly fixed on the substrate by an adhesive. Since the thermal expansion coefficient of the adhesive is larger than that of the semiconductor element, there may be strip off between the semiconductor element and the adhesive. In order to reduce the difference in the thermal expansion coefficient, an insulating filler such as a silica-based filler which is smaller than a binder (or a resin) in the thermal expansion coefficient may be put in the adhesive.

Figure 11:
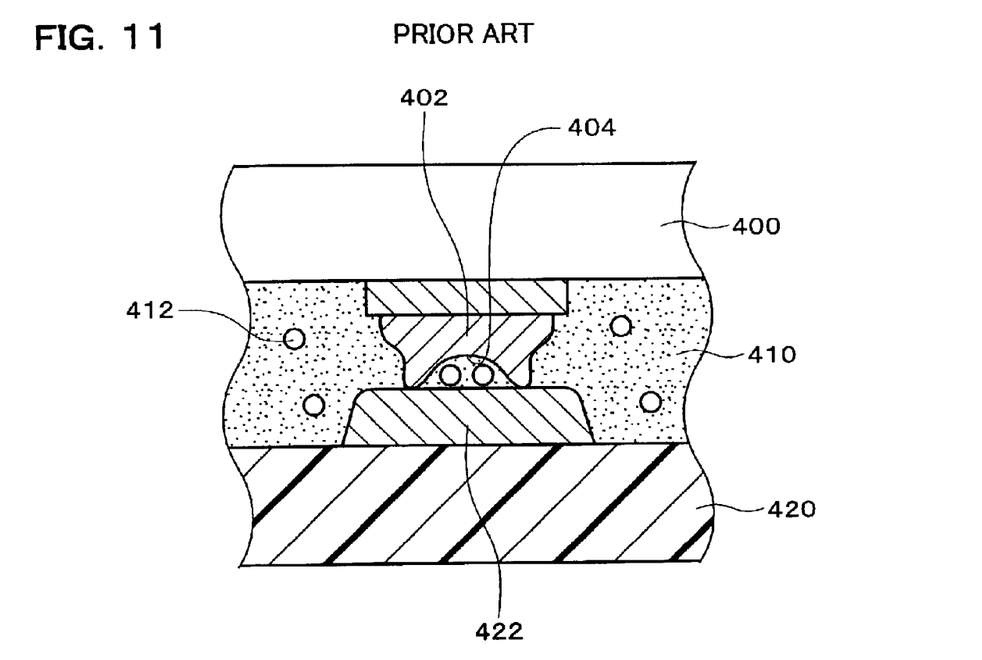
FIG. 11 is a sectional view showing a bump of a semiconductor device in the prior art.

However, if a bump having a height larger than a predetermined value is used as shown in FIG. 11, it may occur that the shape of a bump 402 is deformed to have a relatively large recess 404 in an end surface in a process of pressing a semiconductor chip 400 against a substrate 420 through an adhesive 410 containing an insulating filler 412. It has been found from experimental results that a force applied to the end surface of the bump 402 from the adhesive 410 is increased since the adhesive 410 containing an insulating filler 412 such as a silica-based filler has low fluidity and high viscosity. The bump 402 is easy to deform when its height is large (e.g. when a small load is applied for leveling), and the deformation of the bump starts before the bump passes through the adhesive 410 and is electrically connected to an interconnecting pattern 422 of the substrate 420. As a result, the recess 404 is formed in the end surface of the bump 402 facing the interconnecting pattern 422 of the substrate 420.

As shown in FIG. 11, if the recess 404 is formed in the end surface of the bump 402, an insulating binder (or resin) or the filler 412 readily gathers in the recess 404. The electrical connection between the bump 402 and the interconnecting pattern 422 is affected by these insulating binder (or resin) and filler 412. However, there has been a difficulty in controlling the insulating filler 412.

BRIEF SUMMARY OF THE INVENTION

According to a first aspect of the present invention, there is provided a method of manufacturing a semiconductor device comprising:

(a) providing a conductive member on each of electrodes of a semiconductor element;

(b) pressing the conductive member into a shape having a height equal to or smaller than substantially two-thirds of the original height to provide a bump;

(c) causing the semiconductor element to face a substrate having an interconnecting pattern with an adhesive containing an insulating filler interposed; and (d) pressing at least one of the semiconductor element and the substrate to electrically connect the bumps to the interconnecting pattern.

According to a second aspect of the present invention, there is provided a method of manufacturing a semiconductor device comprising:

providing an adhesive containing an insulating filler between a semiconductor chip having bumps and a substrate having interconnecting lines each of which is narrower than each of the bumps; and applying a pressure to the semiconductor chip toward the adhesive and the substrate to form a recess in an end surface of each of the bumps and electrically connect the bumps to the interconnecting lines.

According to a third aspect of the present invention, there is provided a method of manufacturing a semiconductor device comprising:

providing an adhesive containing an insulating filler between a semiconductor chip having bumps and a substrate having interconnecting lines each of which has a projection; and applying a pressure between the semiconductor chip and the substrate to form a recess in an end surface of each of the bumps due to a pressure from the adhesive, the projection of each of the interconnecting lines being inserted into the recess of each of the bumps to electrically connect the bumps to the interconnecting lines.

A semiconductor device according to a fourth aspect of the present invention is manufactured by any one of the above described methods of manufacturing a semiconductor device.

A circuit board according to a fifth aspect of the present invention has the above semiconductor device.

An electronic instrument according to a sixth aspect of the present invention has the above semiconductor device.

DETAILED DESCRIPTION OF THE EMBODIMENT

The present invention may provide a semiconductor device having a high reliability and uniform quality with bumps less deformable, a method of manufacturing the semiconductor device, a circuit board and an electronic instrument.

(1) A method of manufacturing a semiconductor device according to one embodiment of the invention comprises:

(a) providing a conductive member on each of electrodes of a semiconductor element;

(b) pressing the conductive member into a shape having a height equal to or smaller than substantially two-thirds of the original height to provide a bump;

(c) causing the semiconductor element to face a substrate having an interconnecting pattern with an adhesive containing an insulating filler interposed; and (d) pressing at least one of the semiconductor element and the substrate to electrically connect the bumps to the interconnecting pattern.

According to this embodiment of the invention, the bumps are made less deformable. Accordingly, the force required to deform an end surface of each of the bumps is greater than a force required for the bump to push the adhesive aside. Accordingly, it is possible to prevent an end surface of the bump from being deformed to have a recess due to a force from the adhesive before the bump touches the adhesive and is electrically connected to an interconnecting pattern of the substrate. Namely, even where the semiconductor element and the substrate are firmly fixed through an adhesive, it is possible to prevent an insulating binder (or resin) or filler from gathering excessively on connection surfaces between the bumps and the interconnecting pattern during bonding. This can reduce a drop of resistance in electrical connection between the bump and interconnecting pattern. Furthermore, the controllability in putting an insulating filler or the like aside is improved. Accordingly, it is possible to reduce the variation in electrical characteristic between semiconductor devices. Consequently, the semiconductor device can be improved in reliability and uniformity of quality.

(2) In this method of manufacturing a semiconductor device, a tip of a wire may be formed into a ball shape; the ball of the wire may be bonded to each of the electrodes of the semiconductor element; and the wire may be cut to leave the ball on the electrode to form the conductive member on the electrode, in the step (a).

(3) In this method of manufacturing a semiconductor device, the adhesive may be an anisotropic conductive material containing a conductive filler; and the conductive filler may be interposed between the bumps and the interconnecting pattern, in the step (d).

(4) In this method of manufacturing a semiconductor device, the bump may be formed of a material containing gold.

(5) In this method of manufacturing a semiconductor device, the steps (a) and (b) may be carried out on a semiconductor wafer having a plurality of the semiconductor elements; the semiconductor wafer may be cut into a plurality of semiconductor chips each of which has one of the semiconductor elements, before the step (c); and the steps (c) and (d) may be carried out on the semiconductor chips.

This makes it possible to form the bumps in wafer level processing, so the method is excellent in production efficiency.

(6) In this method of manufacturing a semiconductor device, the semiconductor element may be a semiconductor chip.

(7) A method of manufacturing a semiconductor device according to one embodiment of the invention comprises:

providing an adhesive containing an insulating filler between a semiconductor chip having bumps and a substrate having interconnecting lines each of which is narrower than each of the bumps; and applying a pressure to the semiconductor chip toward the adhesive and the substrate to form a recess in an end surface of each of the bumps and electrically connect the bumps to the interconnecting lines.

According to this embodiment of the invention, the recess to be formed in each of the bumps can be made small because the interconnecting lines are narrow. Further, an area for the electrical connection between the interconnecting lines and the bumps can be increased because the interconnecting lines can be respectively inserted into the recesses of the bumps.

(8) In this method of manufacturing a semiconductor device, the bumps may push the adhesive aside to achieve the electrical connection between the bumps and the interconnecting lines; and the recesses may be formed when the bumps push aside the adhesive.

(9) In this method of manufacturing a semiconductor device, each of the interconnecting lines may have an end surface having a width narrower than a width of the end surface of each of the bumps.

(10) In this method of manufacturing a semiconductor device, each of the interconnecting lines may have a bottom portion and a top portion which is narrower than the bottom portion.

(11) A method of manufacturing a semiconductor device according to one embodiment of the invention comprises:

providing an adhesive containing an insulating filler between a semiconductor chip having bumps and a substrate having interconnecting lines each of which has a projection; and applying a pressure between the semiconductor chip and the substrate to form a recess in an end surface of each of the bumps due to a pressure from the adhesive, the projection of each of the interconnecting lines being inserted into the recess of each of the bumps to electrically connect the bumps to the interconnecting lines.

According to this embodiment of the invention, each of the interconnecting lines has a projection which is inserted into a recess in each of the bumps, so that the area for electrical connection between the bumps and interconnecting lines can be increased. Consequently, poor connection is less to occur.

(12) A semiconductor device according to one embodiment of the invention is manufactured by any one of the above-described methods of manufacturing a semiconductor device.

(13) A circuit board according to one embodiment of the invention has the above semiconductor device.

(14) An electronic instrument according to one embodiment of the invention has the above semiconductor device.

Embodiments of the present invention will now be described with reference to the drawings. It should be noted that the invention is not limited to the following embodiments.

First Embodiment

A method of manufacturing a semiconductor device according to a first embodiment of the present invention will be described below with reference to FIGS. 1A to 5. Note that the manufacturing method of this embodiment includes a method of forming a bump shown in FIGS. 1A to 3.

Figure 1A:
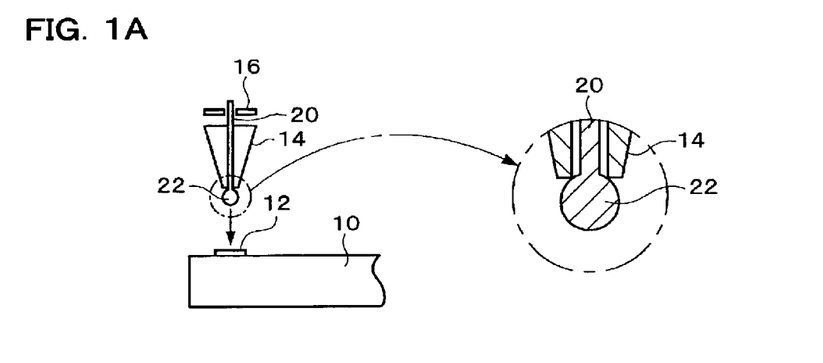
FIGS. 1A to 1C show a method of manufacturing a semiconductor device according to a first embodiment of the present invention.

As shown in FIG. 1A, there is provided a semiconductor element having one or more (a plurality in many cases) of electrodes (or pads) 12. In this example, the semiconductor element is a semiconductor chip 10. Alternatively, the semiconductor element may be part of a semiconductor wafer 50 (see FIG. 3), as referred later.

The semiconductor chip 10 may be formed spherical but, in many cases, is formed in a cuboidal form. The electrodes 12 in plurality are formed on a surface of the semiconductor chip 10 formed with an integrated circuit (active surface). The electrodes 12 may be arrayed on any of the sides of the semiconductor chip 10 (e.g. on the opposite two or four sides) The electrode 12 may be formed of aluminum, copper or the like.

On the semiconductor chip 10, usually a passivation film (not shown) is formed avoiding the electrodes 12. The passivation film may be formed of $SiO_2$, SiN or polyimide resin, for example.

A capillary 14 is arranged on a side of the surface of the semiconductor chip 10 formed with the electrodes 12. A wire 20 is inserted in the capillary 14. The wire 20 may be in a width (thickness) of approximately 20 to 30 $\mu$m but can be determined freely depending on the size of a ball 22 to be formed at a tip thereof. The wire 20, in many cases, is formed of gold, copper or aluminum but not especially limited provided that it is of an electrically conductive material. The material of the wire 20 provides a material to structure a bump 40.

At first, a ball 22 is formed at a tip of the wire 20 at an outside of the capillary 14. The ball 22 is formed by an electric discharge under high pressure, for example, by an electric torch (not shown). The ball 22 is formed nearly in a spherical form, the diameter of which (e.g. approximately 60 $\mu$m) can be determined depending on a width of the wire 20 or discharge time.

Figure 1B:
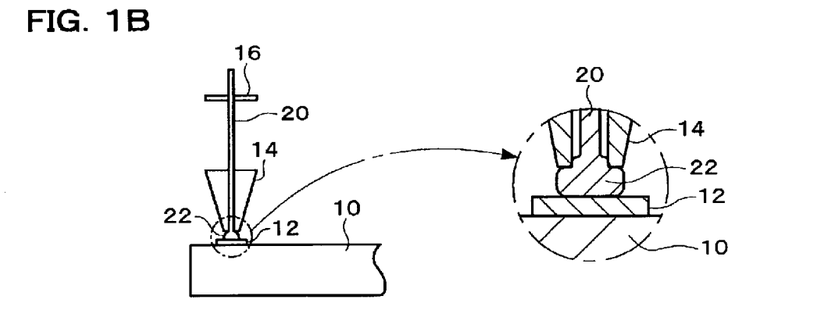

Then, the capillary 14 is positioned above any one of the electrodes 12, to position the ball 22 above the electrode 12. By releasing a clamper 16, the capillary 14 is descended to press the ball 22 against the electrode 12. The ball 22 is urged at a constant pressure onto the electrode 12 to apply a ultrasonic wave or heat during the urging. In this manner, the ball 22 of the wire 20 is bonded onto the electrode 12, as shown in FIG. 1B. Incidentally, the ball 22 is increased in its diameter (e.g. approximately 80 $\mu$m) by being bonded to the electrode 12.

Figure 1C:
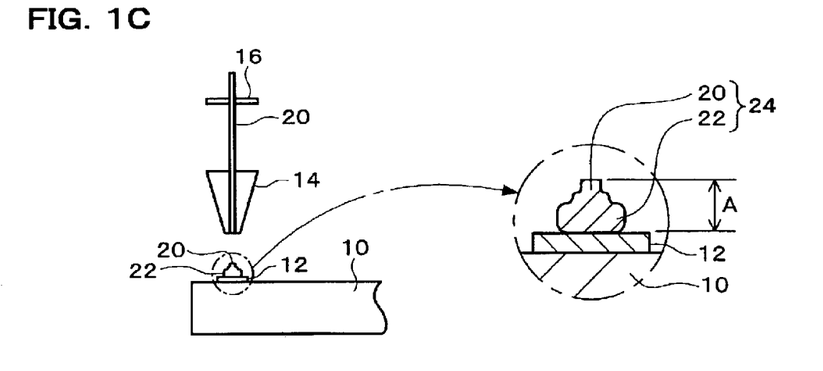

Thereafter, the damper 16 is closed to hold the wire 20. The capillary 14 and the damper 16 are raised simultaneously, as shown in FIG. 1C. The wire 20 is pulled off to leave a portion including the ball 22 on the electrode 12. In this manner, a conductive member 24 as a part of the wire 20 and ball 22 can be provided on the electrode 12. In the case there are a plurality of electrodes 12 requiring to form bumps 40, the above process is repeated on every electrode 12.

Since the conductive member 24 left on the electrode 12 is formed by cutting the wire 20, it often has a projected shape and a small uneven surface. Meanwhile, the axial height A of the conductive member 24 (e.g. approximately 60 to 70 $\mu$m) is determined by the size (diameter) of a pre-bonding ball 22, load onto the ball 22 by the capillary 14, height of a wire 20 connected to and left on the ball 22 and the like. Incidentally, because the conductive member 24 is formed by cutting the wire 20, there occurs somewhat variation in the height of each conductive member 24 on the semiconductor chip 10.

Figure 2A:
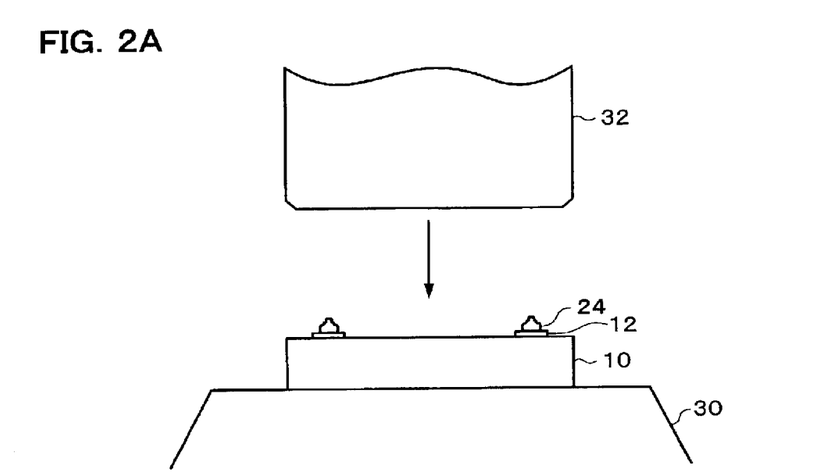
FIGS. 2A to 2C show a method of manufacturing a semiconductor device according to a first embodiment of the present invention.
Figure 2B:
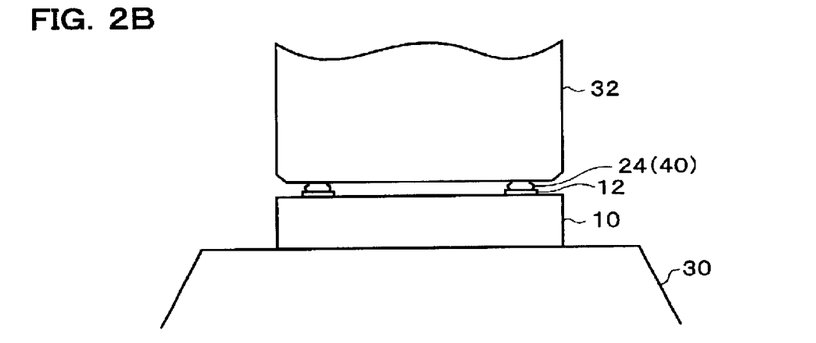
Figure 2C:
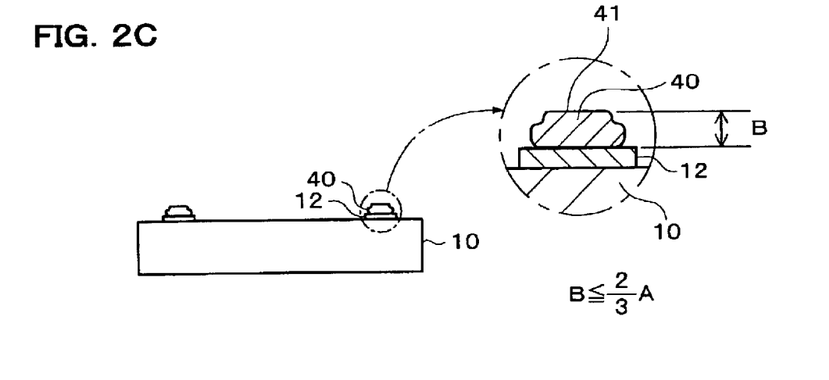

Next, the process shown in FIGS. 2A and 2B is made to form a predetermined height of bump 40 on the semiconductor chip 10, as shown in FIG. 2C.

The conductive member 24 thus provided by a nail head scheme, after resting the semiconductor chip 10 having the conductive member 24 on a table 30 as shown in FIG. 2A, is pressed by a press jig 32 as shown in FIG. 2B. Namely, leveling is made for the conductive member 24 on the semiconductor chip 10. If there are a plurality of electrodes 12 each having the conductive member 24, the conductive members 24 may be pressed at one time. This can eliminate (or reduce) the variation in height between the conductive members 24.

In the process of pressing the conductive members 24, the load applied upon leveling is increased to make the height of the conductive member 24 (the height of the bump 40) equal to or smaller than substantially two-thirds of the original height, thereby obtaining a bump 40. Namely, describing this with the signs in FIGS. 1C and 2C, pressing is done such that a height B of the pressed conductive member (or height of the bump 40 prior to mounting on a substrate) is equal to or smaller than substantially two-thirds of the original height A of the conductive member (to have a relationship: $B \leq 2A/3$). Note that the height of the conductive member or bump refers to the distance from a bottom surface to the highest point of the conductive member or bump.

Due to this, in the subsequent process, specifically "in a process of mounting the semiconductor chip 10 onto a substrate 60 such that the bump 40 is electrically connected to the interconnecting pattern 62 by urging after a process to place the semiconductor chip 10 at its surface having the bump 40 facing to a surface of a substrate 60 having an adhesive containing an insulating filler 68 (including adhesive sheet)", the bump 40 is prevented from being deformed in a height direction (axial direction), i.e. it is prevented that a recess is made in an end surface of the bump 402 as in FIG. 11. Herein, the insulating filler 68 is a silica-based filler and may use a maximum particle size of approximately 1 $\mu$m. Meanwhile, the adhesive is provided to a thickness of approximately 35 $\mu$m on the substrate or the semiconductor chip 10 and may use an epoxy resin as a binder material.

In the process of pressing the conductive member 24, if the conductive member 24 before pressing has a height A of approximately 60 to 70 $\mu$m for example, a height B of the pressed conductive member 24 may be approximately 40 $\mu$m or less. The height B of the conductive member 24 can be decreased to a lowest possible height. However, $0<B$ must be satisfied in order to secure a height to achieve electrical connection between the bump 40 and the interconnecting pattern 62 on the substrate 60 when mounting the semiconductor chip 10. Accordingly, as showing in FIGS. 1C and 2C, the relationship: $0<B \leq 2A/3$ may be held for the height B of the bump 40. The pressed conductive member 24 has an increased diameter, and the diameter may be taken to such a size as not to cause shorting between the adjacent bumps 40 taking into consideration the pitch between respective electrodes 12 of the semiconductor chip 10.

In this manner, bumps 40 are formed on the respective electrodes 12, as shown in FIG. 2C. The bump 40 may be made nearly flat at the end surface 41 by pressing part of the cut wire 20. For example, the end surface 41 of the bump 40 may have a diameter of approximately 40 to 50 $\mu$m. Also, the bump 40 may be formed of a material containing Au. Alternatively, the bump 40 may have a projected shape due to part of the cut wire 40 even after the leveling.

Figure 3:
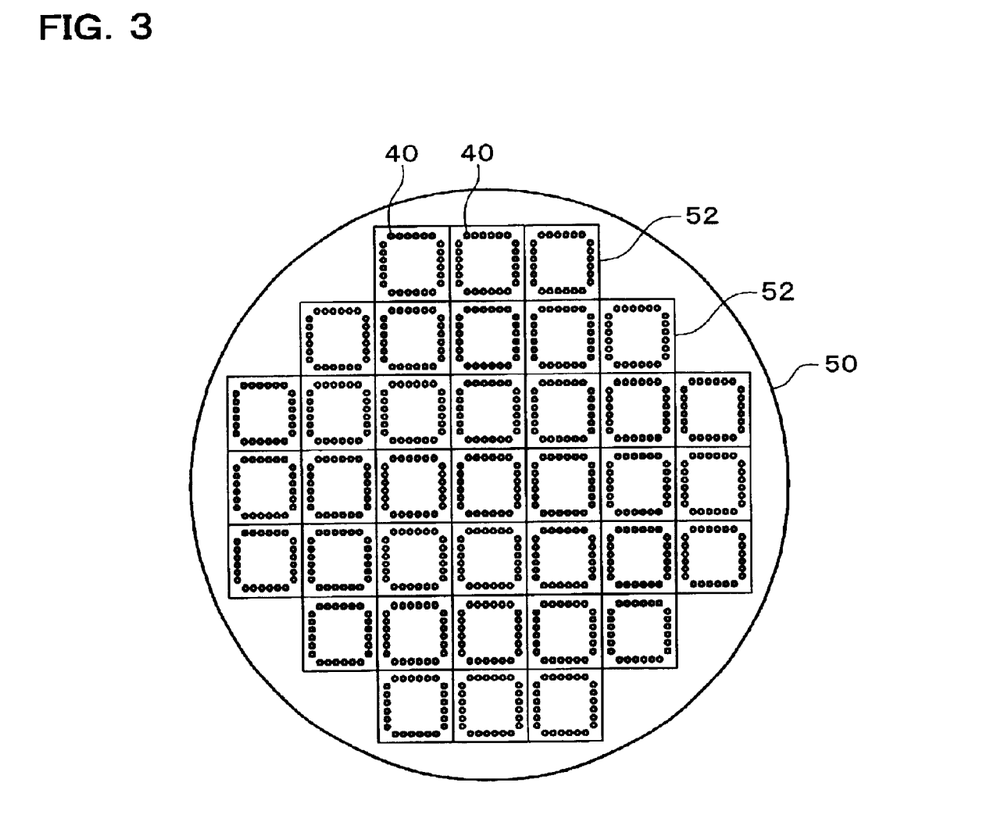
FIG. 3 shows a modification of the method of manufacturing a semiconductor device according to the first embodiment of the present invention.

As a modification of this embodiment, a plurality of bumps 40 may be formed on a semiconductor wafer 50, as shown in FIG. 3. The semiconductor wafer 50 has a plurality of semiconductor elements 52. The semiconductor element 52 refers to a portion to be cut into a semiconductor chip in a process after forming the bumps 40. The plurality of conductive members provided on the semiconductor wafer 50 may be pressed for each semiconductor element 52 by a press jig, or may be pressed collectively in an area including a plurality of semiconductor elements 52. This can form bumps 40 in wafer level processing, enabling high production efficiency. Note that the semiconductor wafer 50 after forming bumps 40 is cut into individual semiconductor elements 52.

Figure 4:
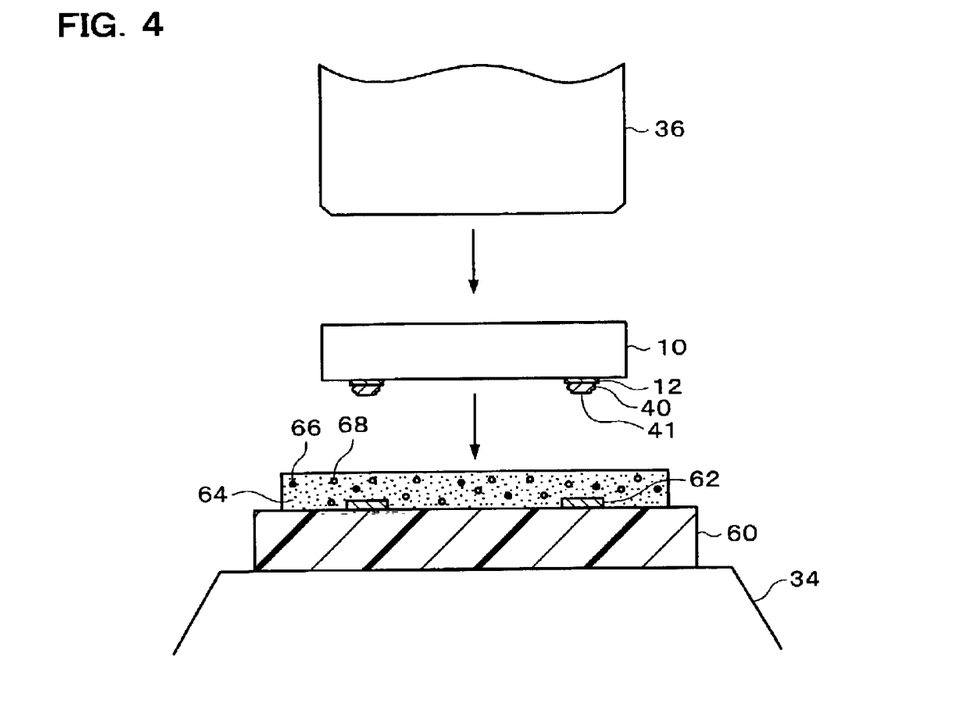
FIG. 4 shows the method of manufacturing a semiconductor device according to the first embodiment of the present invention.
Figure 5:
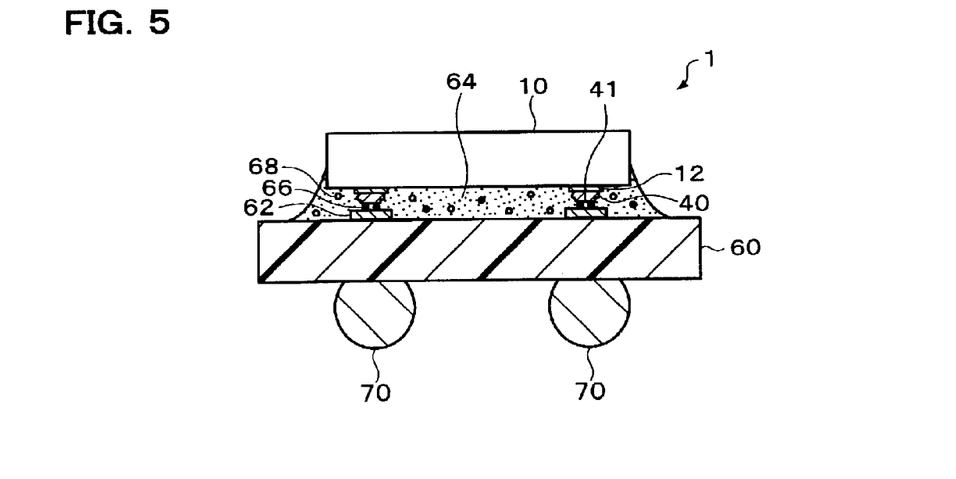
FIG. 5 shows a semiconductor device according to the first embodiment of the present invention.

As shown in FIGS. 4 and 5, the semiconductor chip 10 is mounted on a substrate 60 to make a semiconductor device 1. Namely, as shown in FIG. 4, a substrate 60 is placed on a table 34. The semiconductor chip 10 is mounted face down on the substrate 60 through an adhesive containing an insulating filler 68. The semi conductor chip 10 is mounted with its surface forming bumps 40 faced to the substrate 60.

The substrate 60 maybe formed of any of organic or inorganic material. The substrate 60, in many cases, takes an analogous form to the semiconductor chip 10. Although one semiconductor chip 10 may be mounted on one substrate 60 as shown in FIG. 4, a plurality of semiconductor chips 10 may be mounted on one substrate 60. In the latter case, the semiconductor chip 10 may be arranged in a plurality of rows and columns (in a matrix). In the case that a plurality of semiconductor chips 10 are mounted on one substrate 60, the substrate 60 is cut into individual semiconductor chips 10.

The substrate 60 is formed thereon with an interconnecting pattern 62. The interconnecting pattern 62 is structured with a plurality of interconnecting lines extended in a predetermined form. The plurality of interconnecting lines, in any, have an electrical connection part (e.g. land) to the bump 40.

This embodiment uses an anisotropic conductive material 64 as an adhesive. The anisotropic conductive material 64 is of an insulating binder containing a predetermined amount of conductive filler 66. The anisotropic conductive material 64 may be an anisotropic conductive film or an anisotropic conductive paste. The anisotropic conductive material 64 uses a binder of thermosetting resin (e.g. epoxy resin).

The anisotropic conductive material 64 contains an insulating filler 68, such as a silica-based filler. The insulating filler 68 is dispersed in the binder. This reduces the difference in thermal expansion coefficient between the anisotropic conductive material 64 and the semiconductor chip 10, thereby enhancing the reliability of a semiconductor device. In this embodiment, the anisotropic conductive material 64 may contain 45000/mm$^2$ per unit area of conductive filler 66 and 50 to 60% of insulating filler 68. Also, in this embodiment, the conductive filler 66 may use, as a nucleation material, resin balls plated with a metal layer, such as of Ni and Au plating.

Such an anisotropic conductive material 64 is provided on a surface of the substrate 60, as shown in FIG. 4. Alternatively, the anisotropic conductive material 64 may be provided on a surface of the semiconductor chip 10. The anisotropic conductive material 64 is provided such that it is interposed between the bumps 40 and the interconnecting pattern 62 when the semiconductor chip 10 is mounted on the substrate 60. Meanwhile, in the case of mounting a plurality of semiconductor chips 10 on one substrate 60, the anisotropic conductive material 64 may be integrally provided on the substrate 60 in an area including the mounting areas of the semiconductor chips 10.

As shown in FIG. 4, the semiconductor chip 10 is pressed against the substrate 60 by the press jig 36. In other words, the anisotropic conductive material 64 is pressurized by the both of the semiconductor chip 10 and the substrate 60. In such a case, during pressurizing the anisotropic conductive material 64, an energy (e.g. thermal or optical energy) is applied to cause an adhesion in the binder. On this occasion, the bumps 40 of the semiconductor chip 10 push apart the anisotropic conductive material 64 to electrically connect the bumps 40 with the interconnecting pattern 62. In this case, during pushing apart the anisotropic conductive material 64 by the bump 40, a recess is provided a surface of the bump 40 to be connected to the interconnecting pattern 62.

Herein, the height of the conductive member 24 is made to be equal to or smaller than substantially two-thirds of the original height by increasing the load applied in leveling to form the bump 40. Namely, when mounting face down the semiconductor chip 10 having bumps 40, it is possible not to deform the bump 40 due to a force applied from the anisotropic conductive material 64 to the end surface 41 of the bump 40 before the bump 40 passes through the anisotropic conductive material 64 and is electrically connected to the interconnecting pattern 62 on the substrate 60. This can reduce, to a possible small extent, the recess formed in the connection surface of the bump 40 to the interconnecting pattern 62. This makes it easy to push aside an insulating filler 68 or insulating binder out of the connection surface. Accordingly, the electrical connection between the bump 40 and the interconnecting pattern 62 is prevented from being hindered by an insulating binder or filler 68. Furthermore, it is possible to reduce the variation in electrical characteristic between the semiconductor devices having these connections.

Incidentally, by pressing the semiconductor chip 10 against the substrate 60, the bumps 40 are pressed furthermore (e.g. approximately 10 μm). For example, if the height of the bump 40 before further pressing (or the height B of the pressed conductive member 24) is approximately 40 μm, the bump 40 may be pressed to have a height of approximately 30 μm by the press jig 36.

In this manner, a semiconductor device 1 is manufactured as shown in FIG. 5. The semiconductor device 1 includes a semiconductor chip 10 formed with bumps 40 and a substrate 60 formed with an interconnecting pattern 62. In the example shown in FIG. 5, external terminals 70 are provided on the substrate 60 on a side opposite to the semiconductor chip 20. The external terminals 70 are electrically connected to the interconnecting pattern 62 through not-shown through-holes or the like. The external terminal 70 may be a solder ball, e.g. formed through a reflow process on a printed solder.

According to the semiconductor device of the invention, an insulating filler 68 or insulating binder can be expelled from between the bump 40 and interconnecting pattern 62, to a possible less extent. This, accordingly, can provide a semiconductor device having high reliability in electrical connection between the both.

Incidentally, although the above embodiment used an adhesive containing silica-based filler, besides this an adhesive not containing silica-based filler can be used. Furthermore, although the above embodiment used an anisotropic conductive material, it is possible to use an insulating adhesive or sheet not containing a conductive filler.

Second Embodiment

Figure 6:
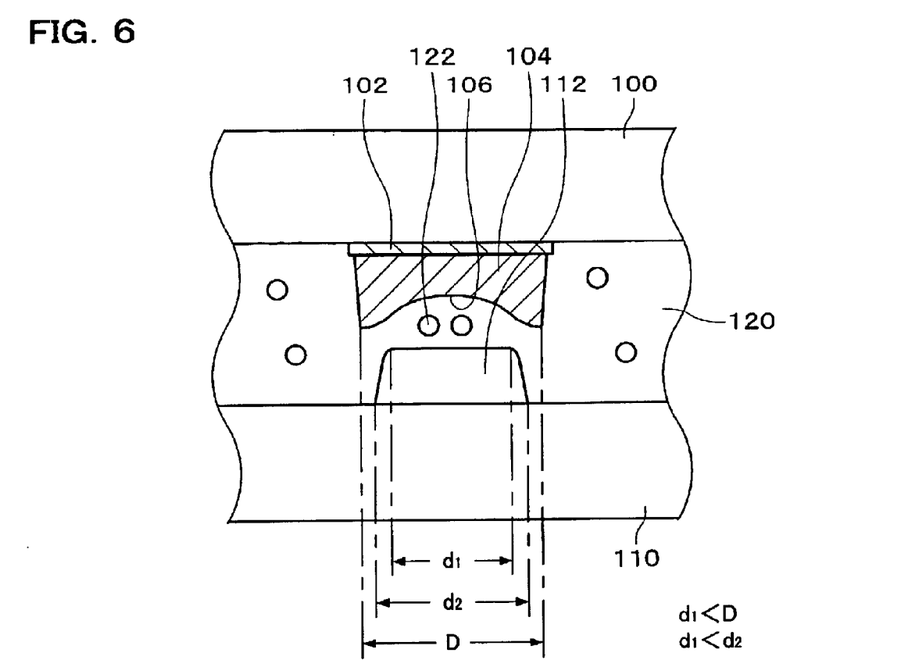
FIG. 6 shows a method of manufacturing a semiconductor device according to a second embodiment of the present invention.

FIG. 6 is a view explaining a manufacturing method for a semiconductor device according to a second embodiment of the invention. In this embodiment, a semiconductor chip 100 is mounted (bonded face down) on a substrate 110. A bump 104 is formed on an electrode (pad) 102 of the semiconductor chip 100. An interconnecting line 112 is formed on the substrate 110. The interconnecting line 112 has an upper end (e.g. a top surface) width (e.g. a diameter or a side length) $d_1$ which is smaller than a lower end (e.g. a bottom surface) width (e.g. a diameter or a side length) $d_2$. Also, the top end width $d_1$ of the interconnecting line 112 is narrower than a top end width D of the bump 104.

In this embodiment, an adhesive 120 containing an insulating filler 122 is placed between the semiconductor chip 100 and the substrate 110. Then, a pressure force is applied to between the semiconductor chip 100 and the substrate 110, to form a recess 106 in the top end surface of the bump 104 by the pressure from the adhesive 120. Thereafter, electrical connection is done between the bump 104 and the interconnecting line 112.

Note that the bump 104 is provided in a state not having a recess 106, and the recess 106 is formed in a bonding process. Since the relationship: $d_1<D$ is held in this embodiment, however, a force applied from the adhesive 120 to a top surface of the bump 104 is reduced, causing the size of the recess 106 in the bump 104 smaller. Meanwhile, since the interconnecting line 112 comes in the recess 106, the both have an increased area for the electrical connection. Furthermore, since there is a relationship: $d_1<d_2$, the strength of the interconnecting line 112 is held and its top surface can be made smaller, thus increasing the above-described effect. The content described with respect to the first embodiment can be applied to this embodiment.

Third Embodiment

Figure 7:
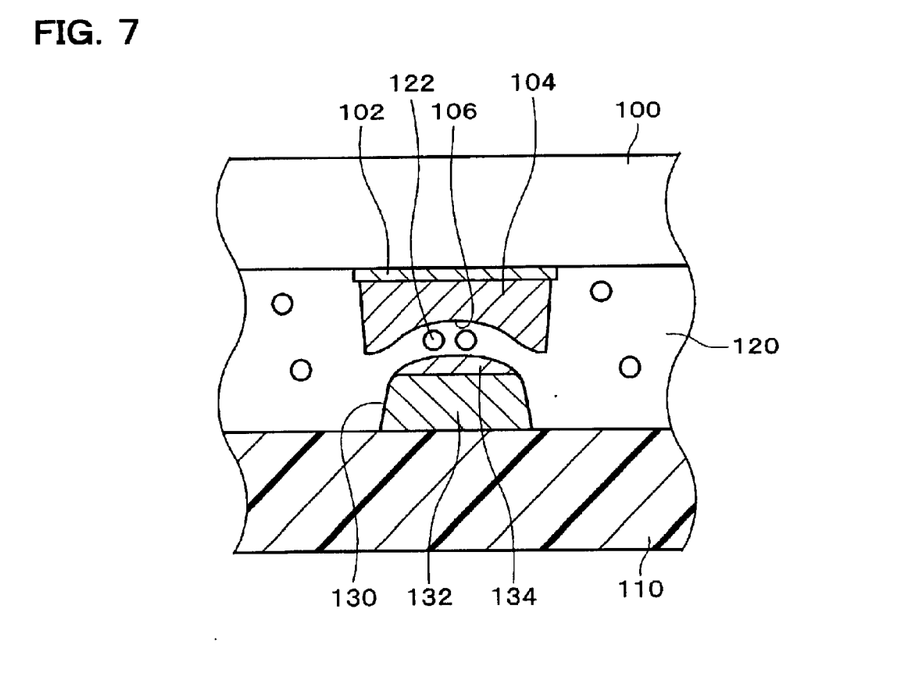
FIG. 7 shows a method of manufacturing a semiconductor device according to a third embodiment of the present invention.

FIG. 7 is a view explaining a manufacturing method for a semiconductor device according to a third embodiment of the invention. This embodiment is different from the second embodiment in that an interconnect 130 has a projection 134. The recess 134 may be formed thick in its center region. The interconnect 130 may be formed with a conductor layer 132 and the projection 134 thereon. In such a case, the projection 134 may be formed of solder. Alternatively, the projection 134 and the lower layer may be integrally formed of one material.

In this embodiment, the projection 134 of the interconnect 130 is fitted in the recess 106 of the bump 104 to electrically connect between the bump 104 and the interconnect 130. This can increase the area of electrical connection of between the interconnect 130 and the bump 104. Due to this, poor connection is less to occur. The other content of this embodiment is as described in the second embodiment.

Figure 8:
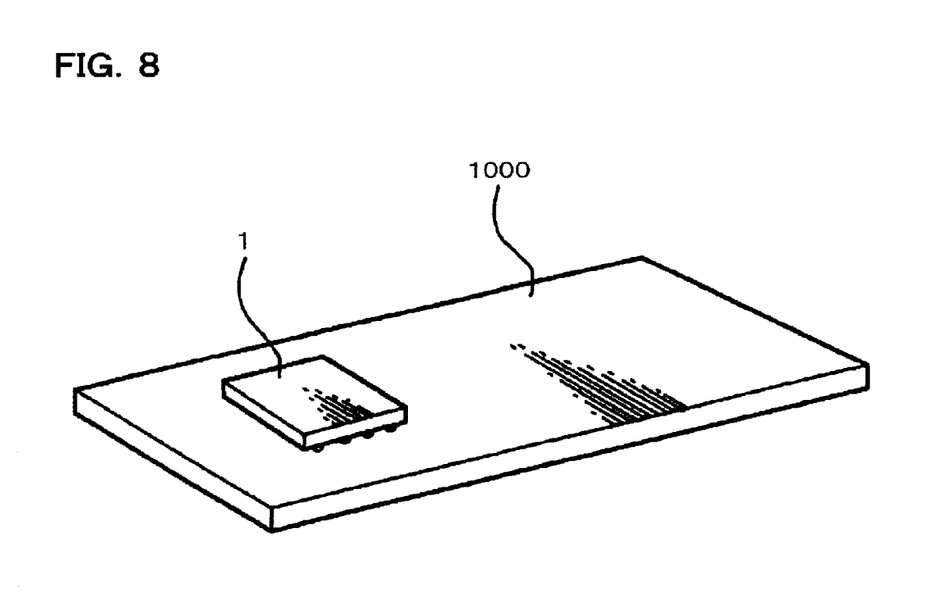
FIG. 8 shows a circuit board according to one embodiment of the present invention.

FIG. 8 shows a circuit board 1000 mounted thereon with a semiconductor device 1 to which the invention is applied. The circuit board 1000 generally uses an organic board or a glass epoxy board. The circuit board 1000 has an interconnecting pattern, e.g. of copper, formed in a predetermined circuit. Electrical conductivity is obtained by mechanically connecting the interconnecting pattern to the external terminals of the semiconductor device.

Figure 9:
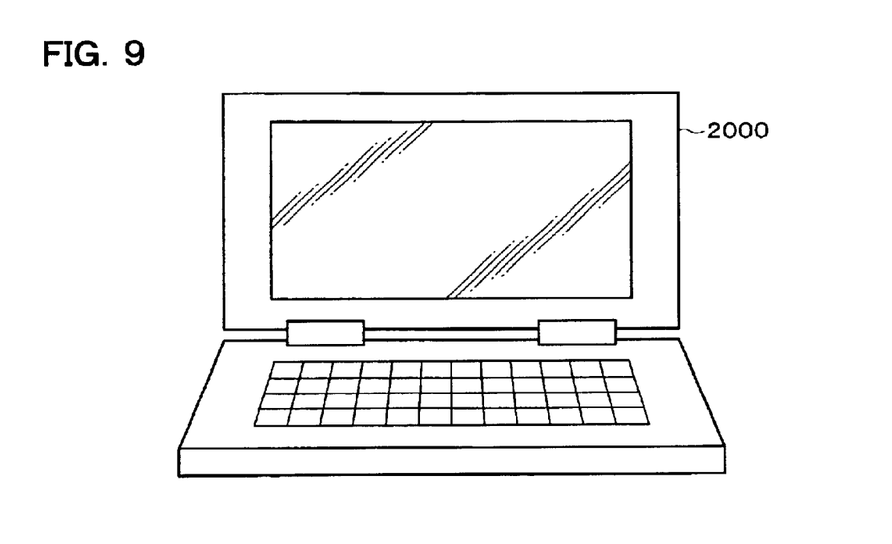
FIG. 9 shows an electronic instrument according to one embodiment of the present invention.
Figure 10:
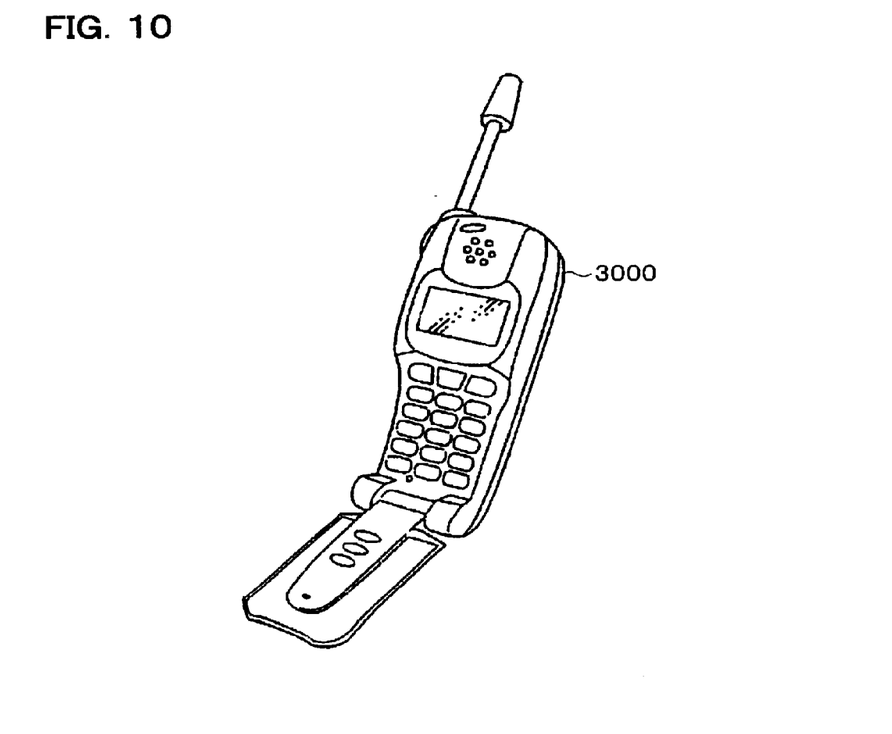
FIG. 10 shows an electronic instrument according to one embodiment of the present invention.

FIG. 9 shows a notebook personal computer 2000 while FIG. 10 shows a cellular phone 3000, as an electronic instrument having a semiconductor device 1 to which the present invention is applied, or as an electronic instrument having the above circuit board 1000.

What is claimed is:

1. A method of manufacturing a semiconductor device comprising:
   (a) providing each of conductive members on each of electrodes of a semiconductor element;
   (b) pressing the conductive members into a shape where each of the conductive members has a height equal to or smaller than substantially two-thirds of the original height to form bumps;
   (c) causing the semiconductor element to face a substrate having an interconnecting pattern with an adhesive containing an insulating filler interposed, the interconnecting pattern including interconnecting lines each of which is narrower than each of the bumps; and
   (d) pressing at least one of the semiconductor element and the substrate to form a recess in an end surface of each of the bumps due to a pressure from the adhesive and to electrically connect the bumps to the interconnecting pattern.

2. The method of manufacturing a semiconductor device as defined in claim 1, wherein:
   a tip of a wire is formed into a ball shape;
   the ball of the wire is bonded to each of the electrodes of the semiconductor element; and
   the wire is cut to leave the ball on each of the electrodes to form each of the conductive members on each of the electrodes, in the step (a).

3. The method of manufacturing a semiconductor device as defined in claim 1,
   wherein the adhesive is an anisotropic conductive material containing a conductive filler; and
   wherein the conductive filler is interposed between the bumps and the interconnecting pattern, in the step (d).

4. The method of manufacturing a semiconductor device as defined in claim 1,
   the bumps being formed of a material containing gold.

5. The method of manufacturing a semiconductor device as defined in claim 1, wherein:
   the steps (a) and (b) are carried out on a semiconductor wafer having a plurality of the semiconductor elements;
   the semiconductor wafer is cut into a plurality of semiconductor chips each of which has one of the semiconductor elements, before the step (c); and
   the steps (c) and (d) are carried out on the semiconductor chips.

6. The method of manufacturing a semiconductor device as defined in claim 1,
   the semiconductor element being a semiconductor chip.

7. A method of manufacturing a semiconductor device comprising:
   providing an adhesive containing an insulating filler between a semiconductor chip having bumps and an organic substrate including an interconnecting pattern, the interconnecting pattern including interconnecting lines each of which is narrower than each of the bumps; and
   applying a pressure to the semiconductor chip toward the adhesive and the organic substrate to form a recess in an end surface of each of the bumps due to a pressure from the adhesive and electrically connect the bumps to the interconnecting lines.

8. The method of manufacturing a semiconductor device as defined in claim 7,
   wherein the bumps push the adhesive aside to make the electrical connection between the bumps and the interconnecting lines; and
   wherein the recesses are formed when the bumps push the adhesive aside.

9. The method of manufacturing a semiconductor device as defined in claim 7,
   wherein each of the interconnecting lines has an end surface having a width narrower than a width of the end surface of each of the bumps.

10. The method of manufacturing a semiconductor device as defined in claim 7, each of the interconnecting lines having a bottom portion and a top portion which is narrower than the bottom portion.

11. A method of manufacturing a semiconductor device comprising:

providing an adhesive containing an insulating filler between a semiconductor chip having bumps and an organic substrate including an interconnecting pattern, the interconnecting pattern including interconnecting lines each of which has a projection; and applying a pressure between the semiconductor chip and the organic substrate to form a recess in an end surface of each of the bumps due to a pressure from the adhesive, the projection of each of the interconnecting lines being inserted into the recess of each of the bumps to electrically connect the bumps to the interconnecting lines.

* * * * *